United States Patent
Tang et al.

(10) Patent No.: US 9,876,164 B1
(45) Date of Patent: Jan. 23, 2018

(54) METHOD AND SYSTEM FOR PROVIDING A LOW MOMENT FREE LAYER MAGNETIC JUNCTION USABLE IN SPIN TRANSFER TORQUE APPLICATIONS

(71) Applicant: Samsung Electronics Co., Ltd., Gyeonggi-do (KR)

(72) Inventors: Xueti Tang, Fremont, CA (US); Mohamad Towfik Krounbi, San Jose, CA (US); Dustin Erickson, Boise, ID (US); Donkoun Lee, San Jose, CA (US); Gen Feng, North Potomac, MD (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/367,014

(22) Filed: Dec. 1, 2016

Related U.S. Application Data

(60) Provisional application No. 62/403,138, filed on Oct. 1, 2016.

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 43/10* | (2006.01) |
| *H01L 43/12* | (2006.01) |
| *H01L 43/08* | (2006.01) |
| *H01L 27/22* | (2006.01) |
| *G11C 11/16* | (2006.01) |

(52) U.S. Cl.
CPC .......... *H01L 43/10* (2013.01); *G11C 11/161* (2013.01); *G11C 11/165* (2013.01); *H01L 27/226* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 8,363,459 B2 | 1/2013 | Zhu | |
| 8,456,781 B2 | 6/2013 | Zhao | |
| 8,981,505 B2 | 3/2015 | Moriyama | |
| 9,040,178 B2 | 5/2015 | Zhao | |
| 9,070,381 B1 * | 6/2015 | Yang | G11B 5/3106 |
| 9,070,870 B2 * | 6/2015 | Zhu | G11C 11/16 |

(Continued)

*Primary Examiner* — Bradley K Smith
*Assistant Examiner* — David Goodwin
(74) *Attorney, Agent, or Firm* — Convergent Law Group LLP

(57) ABSTRACT

A magnetic junction and method for providing the magnetic junction are described. The magnetic junction resides on a substrate and is usable in a magnetic device. The magnetic junction includes free and pinned layers separated by a nonmagnetic spacer layer. The free layer is switchable between stable magnetic states when a write current is passed through the magnetic junction. The free layer has a free layer perpendicular magnetic anisotropy energy greater than a free layer out-of-plane demagnetization energy. The free layer includes an alloy. The alloy includes $[Co_xFe_yB_z]_uMg_t$, where $u+t=1$ and $x+y+z=1$.

17 Claims, 5 Drawing Sheets

(56) References Cited

U.S. PATENT DOCUMENTS

| | | | |
|---|---|---|---|
| 2008/0239591 A1* | 10/2008 | Fuji | B82Y 10/00 360/324.12 |
| 2011/0318848 A1* | 12/2011 | Choi | B82Y 25/00 438/3 |
| 2012/0063214 A1* | 3/2012 | Min | G11C 11/161 365/158 |
| 2013/0288398 A1* | 10/2013 | Yamamoto | H01L 43/08 438/3 |
| 2015/0255135 A1* | 9/2015 | Tran | G11C 11/161 365/158 |
| 2015/0333254 A1* | 11/2015 | Liu | G01R 33/096 438/3 |
| 2016/0086645 A1* | 3/2016 | Erickson | G11C 11/14 428/811.1 |

* cited by examiner

METHOD AND SYSTEM FOR PROVIDING A LOW MOMENT FREE LAYER MAGNETIC JUNCTION USABLE IN SPIN TRANSFER TORQUE APPLICATIONS

CROSS-REFERENCE TO RELATED APPLICATIONS

This application claims the benefit of provisional Patent Application Ser. No. 62/403,138, filed Oct. 1, 2016, entitled CoFeBMg FOR PERPENDICULAR MTJ, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer may be a single layer or include multiple layers.

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM are desired. For example, a lower switching current may be desired for easier and faster switching. Concurrently, the magnetic junction is desired to remain thermally stable. Accordingly, what is needed is a method and system that may improve the performance of the spin transfer torque based memories. The method and system described herein address such a need.

BRIEF SUMMARY OF THE INVENTION

A magnetic junction and method for providing the magnetic junction are described. The magnetic junction resides on a substrate and is usable in a magnetic device. The magnetic junction includes free and pinned layers separated by a nonmagnetic spacer layer. The free layer is switchable between stable magnetic states when a write current is passed through the magnetic junction. The free layer has a free layer perpendicular magnetic anisotropy energy greater than a free layer out-of-plane demagnetization energy. The free layer includes an alloy. The alloy includes $[Co_xFe_yB_z]_uMg_t$, where u+t=1 and x+y+z=1. Further, u, t, x, y and z are each nonzero.

The magnetic junction having the free layer including a $[Co_xFe_yB_z]_uMg_t$ alloy may have improved performance. Such a free layer may have a reduced saturation magnetization while maintaining a high magnetic anisotropy. The free layer may also have low damping. As a result, switching current may be reduced while maintaining thermal stability. The reduction in switching current may also improve other aspects of performance, such as switching speed. Thus, performance of the magnetic junction and magnetic device employing such a free layer may be enhance.

DETAILED DESCRIPTION OF THE INVENTION

Figure 1:
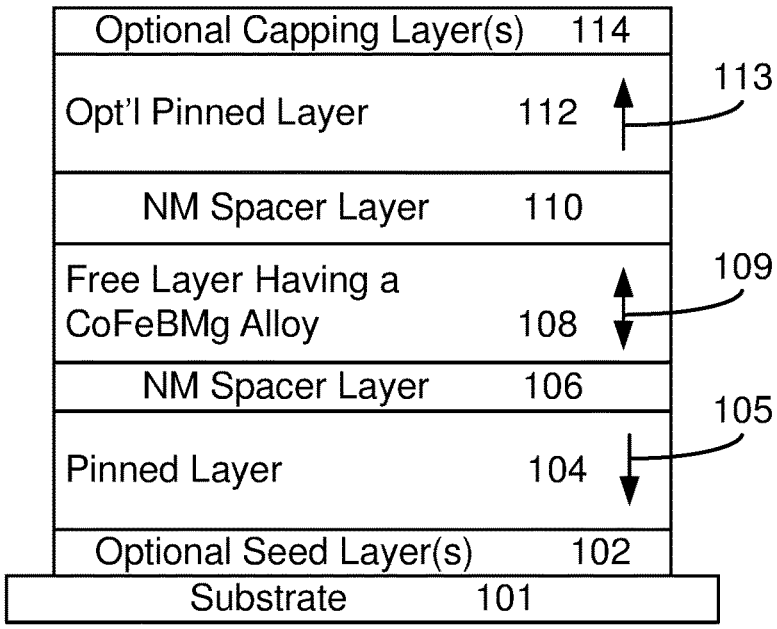
FIG. 1 depicts an exemplary embodiment of a magnetic junction usable in a magnetic devices such as a magnetic memory programmable using spin transfer torque and having a CoFeBMg free layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction and method for providing the magnetic junction are described. The magnetic junction resides on a substrate and is usable in a magnetic device. The magnetic junction includes free and pinned layers separated by a nonmagnetic spacer layer. The free layer is switchable between stable magnetic states when a write current is passed through the magnetic junction. The free layer has a free layer perpendicular magnetic anisotropy energy greater than a free layer out-of-plane demagnetization energy. The free layer includes an alloy. The alloy includes $[Co_xFe_yB_z]_uMg_t$, where $u+t=1$ and $x+y+z=1$. Further, u, t, x, y and z are each nonzero.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

FIG. 1 depicts an exemplary embodiment of a magnetic junction 100 usable in a magnetic devices and having a CoFeBMg free layer. For clarity, FIG. 1 is not to scale. The magnetic junction 100 may be used in a magnetic device such as a spin transfer torque magnetic random access memory (STT-MRAM) and, therefore, in a variety of electronic devices. The magnetic junction 100 may include a pinned layer 104 having a magnetic moment 105, a nonmagnetic spacer layer 106, a free layer 108 having magnetic moment 109, an optional additional nonmagnetic spacer layer 110, and an optional additional pinned layer 112 having magnetic moment 113. Also shown are optional seed layer(s) 102 and capping layer(s) 114. The substrate 101 on which the magnetic junction 100 is formed resides below the seed layers and is shown for c. A bottom contact and a top contact are not shown but may be formed. Similarly, other layers may be present but are not shown for simplicity.

As can be seen in FIG. 1, the magnetic junction 100 is a dual magnetic junction. In another embodiment, the nonmagnetic spacer layer 110 and pinned layer 112 might be omitted. In such an embodiment, the magnetic junction 100 is a bottom pinned magnetic junction. Alternatively, the pinned layer 104 and nonmagnetic spacer layer 106 might be omitted. In such an embodiment, the magnetic junction 100 is a top pinned magnetic junction. Optional pinning layer(s) (not shown) may be used to fix the magnetization of the pinned layer(s) 104 and/or 112. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moments 105 and 113 of the pinned layers 104 and 112, respectively, are pinned by the magnetic anisotropy of the layers 104 and 112, respectively. The free layer 108 and the pinned layers 104 and 112 have a high perpendicular magnetic anisotropy. Stated differently, the perpendicular magnetic anisotropy energy exceeds the out-of-plane demagnetization energy for the layers 104, 108 and 112. Such a configuration allows for the magnetic moments 105, 109 and 113 of the layers 104, 108 and 112, respectively, having a high perpendicular magnetic anisotropy to be stable perpendicular to plane. Stated differently, the magnetic moments of the free layer 108 and pinned layer(s) 104 and 112 are stable out-of-plane.

The magnetic junction 100 is also configured to allow the free layer magnetic moment 109 to be switched between stable magnetic states when a write current is passed through the magnetic junction 100. Thus, the free layer 109 is switchable utilizing spin transfer torque when a write current is driven through the magnetic junction 100 in a current perpendicular-to-plane (CPP) direction. The direction of the magnetic moment 109 of the free layer 108 may be read by driving a read current through the magnetic junction 100.

The nonmagnetic spacer layer(s) 106 and 110 may be tunneling barrier layers. For example, the nonmagnetic spacer layer 106 and/or 110 may be a crystalline MgO tunneling barrier with a (100) orientation. Such nonmagnetic spacer layers 106 and 110 may enhance TMR of the magnetic junction 100. The nonmagnetic spacer layer(s) 106 and 110 may also be considered to serve as seed and capping layers for the free layer 108.

The pinned layer(s) 104 and/or 112 have a perpendicular magnetic anisotropy energy greater than a pinned layer out-of-plane demagnetization energy. Thus, the moments 105 and 113 are stable perpendicular-to-plane. In alternate embodiments, the magnetic moment(s) 105 and/or 113 may be stable in-plane. The pinned layers 104 and 112 are shown as being simple, single layers. However, in other embodiments, the pinned layer(s) 104 and/or 112 may be multilayer(s). For example, the pinned layer(s) 104 and/or 112 might be a synthetic antiferromagnet (SAF) including two magnetically coupled ferromagnetic layers separated by and sandwiching a nonmagnetic layer, such as $R_U$. Alternatively, the pinned layer(s) 104 and/or 112 may be high perpendicular anisotropy ($H_k$) multilayer(s). For example, the pinned layer 104 may be a Co/Pt multilayer. Other pinned layer(s) having other structures may be used. In addition, in alternate embodiments, the pinned layer 102 and/or 112 may have the magnetic moment(s) 105 and/or 113, in plane.

The free layer 108 includes a CoFeBMg alloy. Thus, the free layer may consist of a CoFeBMg alloy layer or may have additional layers. As used herein, a "CoFeBMg" alloy is one which includes Co, Fe, B and Mg but in which the ratios between the constituents is not specified, but may be in the ranges disclosed herein. Similarly, CoFeB refers to a mixture including Co, Fe and B but in which the ratios between the constituents is not specified. CoFeBMg may be the same as to $[Co_xFe_yB_z]_uMg_t$, where the subscripts refer to atomic percentages, u+t=1 and x+y+z=1. In addition, u, t, x, y and t are each nonzero. In some embodiments, t is at least 0.15 and not more than 0.4. In some embodiments, t is not more than 0.35. Thus, the alloy may include not more than thirty-five atomic percent Mg. As a result, the free layer 108 may have a reduced saturation magnetization ($M_s$). Stated differently, the $M_s$ of the $[Co_xFe_yB_z]_uMg_t$ alloy is less than one thousand emu/cc. In some embodiments, the saturation magnetization may be less than six hundred emu/cc. In addition, the B content in the Co may be desired to be limited to a particular range. In some embodiments, the CoFeB includes at least ten atomic percent and not more than sixty atomic percent B (i.e. z is at least 0.1 and not more than 0.6). In some such embodiments, the CoFeB includes not more than forty atomic percent B.

The $[Co_xFe_yB_z]_uMg_t$ alloy may form a layer in the free layer 108. In some embodiments, the free layer 108 consists of the $[Co_xFe_yB_z]_uMg_t$ layer. In other embodiments, free layer 108 includes the $[Co_xFe_yB_z]_uMg_t$ layer as well as other layers. For example, the free layer may include a CoFeB/$[Co_xFe_yB_z]_uMg_t$/Fe trilayer, a $[Co_xFe_yB_z]_uMg_t$/Fe bilayer and/or a CoFeB/$[Co_xFe_yB_z]_uMg_t$ bilayer. In such embodiments, the relationship to the substrate is not fixed. Thus, for the CoFeB/$[Co_xFe_yB_z]_uMg_t$/Fe trilayer, the Fe layer may be closest to the substrate 101 or furthest from the substrate.

As can be seen in FIG. 1, the free layer 108 has a perpendicular magnetic anisotropy that exceeds the out-of-plane demagnetization energy. Thus, the magnetic moment 109 of the free layer 108 may be oriented substantially perpendicular-to-plane. The perpendicular anisotropy of the $[Co_xFe_yB_z]_uMg_t$ layer within the free layer 108 is also high. Thus, the perpendicular magnetic anisotropy energy of the $[Co_xFe_yB_z]_uMg_t$ layer exceeds its out-of-plane demagnetization energy. Without more, therefore, the $[Co_xFe_yB_z]_uMg_t$ would have its moment oriented perpendicular to plane. In order aid in ensuring that this is the case, the thickness of the $[Co_xFe_yB_z]_uMg_t$ layer may be restricted. In some embodiments, the $[Co_xFe_yB_z]_uMg_t$ layer may have a thickness of at least three Angstroms and not more than twenty Angstroms. In some such embodiments, the $[Co_xFe_yB_z]_uMg_t$ layer of the free layer 108 may have a thickness that does not exceed fifteen Angstroms.

The layers surrounding the free layer 108 may be tailored to aid the $[Co_xFe_yB_z]_uMg_t$ layer and the free layer in maintaining a high perpendicular magnetic anisotropy. For example, a seed layer and/or capping layer may be selected from a set of materials in order to enhance the perpendicular magnetic anisotropy energy. In some embodiments, such a seed layer may include one or more of magnesium oxide, tantalum oxide and titanium oxide. The capping layer may include one or more of a magnesium oxide layer, a tantalum oxide layer, a magnesium oxide/tantalum oxide bilayer and a titanium oxide layer. For example, in the dual magnetic junction 100 depicted in FIG. 1, the nonmagnetic spacers 106 and 110 may each be crystalline MgO tunneling barrier layers. Thus, the seed and capping layers would correspond to the nonmagnetic spacer layers 106 and 110, respectively and may consist of MgO. Such nonmagnetic spacer layers 106 and 110 not only improve tunneling magnetoresistance, but may also aid in increasing the perpendicular magnetic anisotropy of the free layer 108. If the layers 110 and 112 are omitted, then the capping layer 104 may include a magnesium oxide layer, a tantalum oxide layer, a magnesium oxide/tantalum oxide bilayer and/or a titanium oxide layer. It the layers 104 and 106 are omitted, then the seed layer 102 may include one or more of magnesium oxide, tantalum oxide and titanium oxide. Such configurations may further enhance the perpendicular magnetic anisotropy energy of the $[Co_xFe_yB_z]_uMg_t$ layer. Thus, the free layer magnetic moment 109 may have its stable states substantially perpendicular-to-plane.

The magnetic junction 100 having the free layer 108 including a $[Co_xFe_yB_z]_uMg_t$ alloy may have improved performance. The free layer 108 may have a reduced saturation magnetization due to the low moment $[Co_xFe_yB_z]_uMg_t$ layer. However, the high perpendicular magnetic anisotropy may be maintained. The free layer 108 may also have low damping due to the $[Co_xFe_yB_z]_uMg_t$ layer. In some embodiments, the damping coefficient may be as low as 0.003 or lower. As a result, switching current may be reduced. Consequently, the free layer may be thermally stable when quiescent (not being written). The reduction in switching current may also improve other aspects of performance, such as switching speed. Thus, performance of the magnetic junction and magnetic device employing such a free layer may be enhanced.

Figure 2:
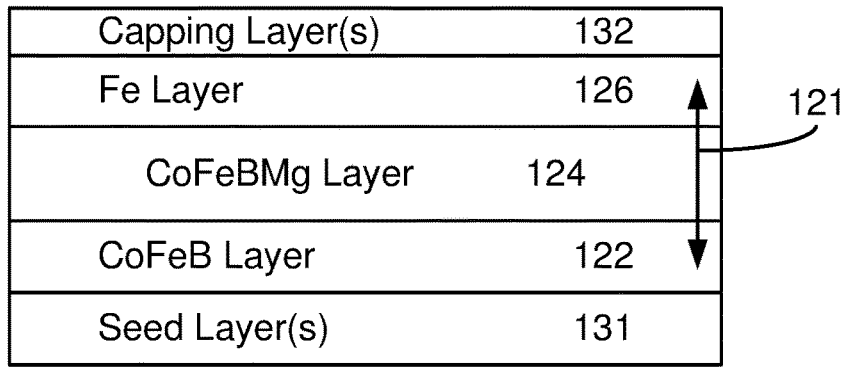
FIG. 2 depicts an exemplary embodiment of a CoFeBMg free layer usable in a magnetic junction.

FIG. 2 depicts an exemplary embodiment of a free layer 120 usable in a magnetic devices such as a magnetic memory programmable using spin transfer torque. For clarity, FIG. 2 is not to scale. The free layer 120 may be used as the free layer 108 in the magnetic junction 100. The free layer 120 includes a CoFeB layer 122, a $[Co_xFe_yB_z]_uMg_t$ layer 124 and an Fe layer 126. In other embodiments, additional layer(s) might be present. In the embodiment shown, the CoFeB layer 122 is closest to the substrate (not shown). In an alternate embodiment, the order of the layers 122, 124 and 126 may be reversed. Thus, the Fe layer 126 might be closest to the substrate. Also shown are seed layer(s) 131 and capping layer(s) 132. However, these layers 131 and 132 are not considered part of the free layer 120.

The CoFeB layer 122 may be at least ten atomic percent and not more than sixty atomic percent B. In some embodiments, for example, the CoFeB layer 122 is nominally forty atomic percent B. The CoFeB layer 122 may also be thin. In some embodiments, the CoFeB layer 122 is at least three Angstroms thick and not more than ten Angstroms thick. For example, the thickness of the CoFeB layer 122 maybe nominally five Angstroms. The Fe layer 126 may also be desired to be thin. In some embodiments, the Fe layer 126 is also at least three Angstroms thick and not more than ten Angstroms thick.

The $[Co_xFe_yB_z]_uMg_t$ layer 124 is analogous to that described above. Thus, in the $[Co_xFe_yB_z]_uMg_t$ layer 124, u, t, x, y and t are each nonzero. The $[Co_xFe_yB_z]_uMg_t$ layer 124 is an alloy, rather than a multilayer. In some embodiments, t is at least 0.15 and not more than 0.4. In some embodiments, t is not more than 0.35. In some embodiments, the $[Co_xFe_yB_z]_uMg_t$ layer 124 has at least twenty-eight atomic percent and not more than thirty-five atomic percent Mg. In such an embodiment, the reduction in saturation magnetization may be optimized. For example, the $M_s$ of the $[Co_xFe_yB_z]_uMg_t$ layer 124 may be less than six hundred emu/cc. In addition, the B content in the CoFeB may be desired to be at least ten atomic percent and not more than sixty atomic percent. In some such embodiments, the CoFeB includes not more than forty atomic percent B.

The $[Co_xFe_yB_z]_uMg_t$ layer 124 and the free layer 120 each has a perpendicular magnetic anisotropy that exceeds the out-of-plane demagnetization energy. Thus, the free layer magnetic moment 121 may have its stable states substantially perpendicular-to-plane. The $[Co_xFe_yB_z]_uMg_t$ layer 124 may have a thickness of at least three Angstroms and not more than twenty Angstroms. In some such embodiments, the thickness of the $[Co_xFe_yB_z]_uMg_t$ layer 124 does not exceed fifteen Angstroms. In addition, the layers surrounding the free layer 120 may be tailored to aid the $[Co_xFe_yB_z]_uMg_t$ layer 124 and the free layer 120 in maintaining a high perpendicular magnetic anisotropy. For example, the seed layer 131 may include one or more of magnesium oxide, tantalum oxide and titanium oxide. The capping layer 132 may include one or more of a magnesium oxide layer, a tantalum oxide layer, a magnesium oxide/tantalum oxide bilayer and a titanium oxide layer. The material selected may depend upon the type of magnetic junction (dual, bottom pinned or top pinned) and the location of the free layer 120.

A magnetic junction including the free layer 120 may have improved performance. The free layer 120 may have a reduced saturation magnetization due to the low moment of the $[Co_xFe_yB_z]_uMg_t$ layer 124. However, the high perpendicular magnetic anisotropy may be maintained. The $[Co_xFe_yB_z]_uMg_t$ layer 124 may also have low damping. As a result, switching current may be reduced. The perpendicular magnetic anisotropy may remain high. Consequently, the free layer 120 may be thermally stable when quiescent. Thus, performance of a magnetic junction and magnetic device employing such a free layer 120 may be improved.

Figure 3:
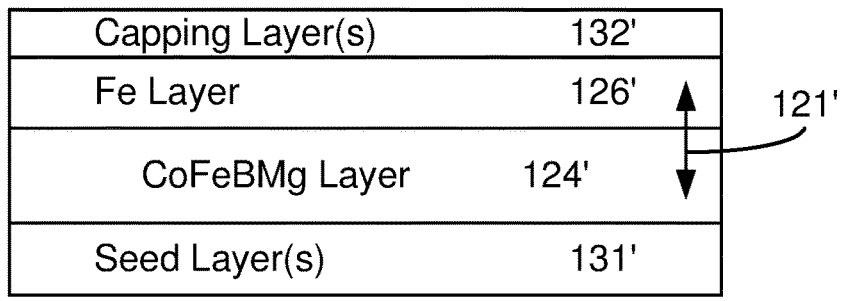
FIG. 3 depicts another exemplary embodiment of a CoFeBMg free layer usable in a magnetic junction.

FIG. 3 depicts another exemplary embodiment of a free layer 120' usable in a magnetic devices such as a magnetic memory programmable using spin transfer torque. For clarity, FIG. 3 is not to scale. The free layer 120' may be used as the free layer 108 in the magnetic junction 100. The free layer 120' is analogous to the free layer 120. Consequently, similar components have analogous labels. The free layer 120' includes a $[Co_xFe_yB_z]_uMg_t$ layer 124' and an Fe layer 126' that are analogous to the $[Co_xFe_yB_z]_uMg_t$ layer 124 and the Fe layer 126, respectively of the free layer 120. In other embodiments, additional layer(s) might be present. In the embodiment shown, the $[Co_xFe_yB_z]_uMg_t$ layer 124' is closest to the substrate (not shown). In an alternate embodiment, the order of the layers 124' and 126' may be reversed. Thus, the Fe layer 126' might be closest to the substrate. Also shown are seed layer(s) 131' and capping layer(s) 132' that are analogous to the seed layer(s) 131 and the capping layer(s) 132, respectively. However, these layers 131' and 132' are not considered part of the free layer 120'.

The $[Co_xFe_yB_z]_uMg_t$ layer 124' is analogous to that described above. Thus, in the $[Co_xFe_yB_z]_uMg_t$ layer 124', u, t, x, y and t are each nonzero. The $[Co_xFe_yB_z]_uMg_t$ layer 124' is an alloy, rather than a multilayer. In some embodiments, t is at least 0.15 and not more than 0.4. In some embodiments, t is not more than 0.35. Thus, the alloy may include not more than thirty-five atomic percent Mg. In some embodiments, the $[Co_xFe_yB_z]_uMg_t$ layer 124' has at least twenty-eight atomic percent and not more than thirty-five atomic percent Mg.

The $[Co_xFe_yB_z]_uMg_t$ layer 124' and the free layer 120' each has a perpendicular magnetic anisotropy that exceeds the out-of-plane demagnetization energy. Thus, the free layer magnetic moment 121' may have its stable states substantially perpendicular-to-plane. The $[Co_xFe_yB_z]_uMg_t$ layer 124' may have a thickness of at least three Angstroms and not more than twenty Angstroms. In some such embodiments, the thickness of the $[Co_xFe_yB_z]_uMg_t$ layer 124' does not exceed fifteen Angstroms. The Fe layer 126' may also be desired to be thin. In some embodiments, the Fe layer 126' is also at least three Angstroms thick and not more than ten Angstroms thick.

The layers surrounding the free layer 120' may be tailored to help the $[Co_xFe_yB_z]_uMg_t$ layer 124' and the free layer 120' maintain a high perpendicular magnetic anisotropy. For example, the seed layer 131' may include one or more of magnesium oxide, tantalum oxide and titanium oxide. The capping layer 132' may include one or more of a magnesium oxide layer, a tantalum oxide layer, a magnesium oxide/tantalum oxide bilayer and a titanium oxide layer. The material selected may depend upon the type of magnetic junction (dual, bottom pinned or top pinned) and the location of the free layer 120'.

A magnetic junction including the free layer 120' may have improved performance. The free layer 120' may have a reduced saturation magnetization due to the low moment of the $[Co_xFe_yB_z]_uMg_t$ layer 124'. However, the high perpendicular magnetic anisotropy may be maintained. The $[Co_xFe_yB_z]_uMg_t$ layer 124' may also have low damping. As a result, switching current may be reduced. The perpendicular magnetic anisotropy may remain high. Consequently, the free layer 120' may be thermally stable when quiescent. Thus, performance of a magnetic junction and magnetic device employing such a free layer 120' may be improved.

Figure 4:
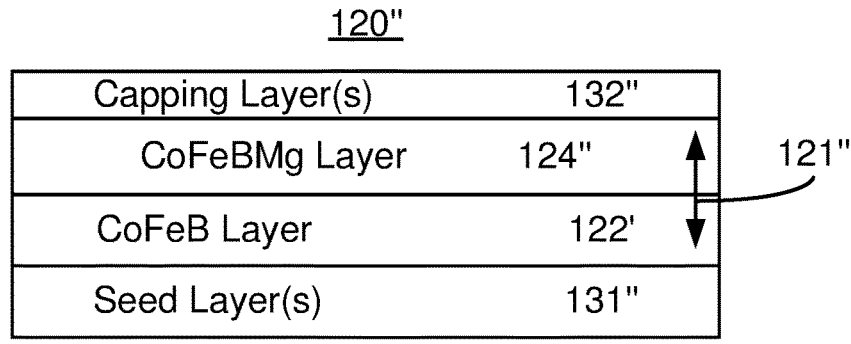
FIG. 4 depicts another exemplary embodiment of a CoFeBMg free layer usable in a magnetic junction.

FIG. 4 depicts another exemplary embodiment of a free layer 120" usable in a magnetic devices such as a magnetic memory programmable using spin transfer torque. For clarity, FIG. 4 is not to scale. The free layer 120" may be used as the free layer 108 in the magnetic junction 100. The free layer 120" is analogous to the free layer(s) 120 and/or 120'. Consequently, similar components have analogous labels.

The free layer 120" includes a $[Co_xFe_yB_z]_uMg_t$ layer 124" and a CoFeB layer 122' that are analogous to the $[Co_xFe_yB_z]_uMg_t$ layer 124/124' and the CoFeB layer 122, respectively of the free layer 120/120'. In other embodiments, additional layer(s) might be present. In the embodiment shown, the $[Co_xFe_yB_z]_uMg_t$ layer 124' is furthest from the substrate (not shown). In an alternate embodiment, the order of the layers 122' and 124' may be reversed. Thus, the CoFeB layer 122' might be closest to the substrate. Also shown are seed layer(s) 131" and capping layer(s) 132" that are analogous to the seed layer(s) 131/131' and the capping layer(s) 132/132', respectively. However, these layers 131" and 132" are not considered part of the free layer 120".

The CoFeB layer 122' is analogous to the CoFeB layer 122 described above. Thus, the CoFeB layer 122' may be at least ten atomic percent and not more than sixty atomic percent B. In some embodiments, for example, the CoFeB layer 122' is nominally forty atomic percent B. The CoFeB layer 122' may also be thin. In some embodiments, the CoFeB layer 122' is at least three Angstroms thick and not more than ten Angstroms thick. For example, the thickness of the CoFeB layer 122' maybe nominally five Angstroms.

The $[Co_xFe_yB_z]_uMg_t$ layer 124" is analogous to that described above. Thus, in the $[Co_xFe_yB_z]_uMg_t$ layer 124", u, t, x, y and t are each nonzero. The $[Co_xFe_yB_z]_uMg_t$ layer 124" is an alloy, rather than a multilayer. In some embodiments, t is at least 0.15 and not more than 0.4. In some embodiments, t is not more than 0.35. Thus, the alloy may include not more than thirty-five atomic percent Mg. In some embodiments, the $[Co_xFe_yB_z]_uMg_t$ layer 124" has at least twenty-eight atomic percent and not more than thirty-five atomic percent Mg.

The $[Co_xFe_yB_z]_uMg_t$ layer 124" and the free layer 120" each has a perpendicular magnetic anisotropy that exceeds the out-of-plane demagnetization energy. Thus, the free layer magnetic moment 121" may have its stable states substantially perpendicular-to-plane. The $[Co_xFe_yB_z]_uMg_t$ layer 124" may have a thickness of at least three Angstroms and not more than twenty Angstroms. In some such embodiments, the thickness of the $[Co_xFe_yB_z]_uMg_t$ layer 124" does not exceed fifteen Angstroms.

The layers surrounding the free layer 120" may be tailored such that the $[Co_xFe_yB_z]_uMg_t$ layer 124" and the free layer 120" may have a high perpendicular magnetic anisotropy. For example, the seed layer 131" may include one or more of magnesium oxide, tantalum oxide and titanium oxide. The capping layer 132" may include one or more of a magnesium oxide layer, a tantalum oxide layer, a magnesium oxide/tantalum oxide bilayer and a titanium oxide layer. The material selected may depend upon the type of magnetic junction (dual, bottom pinned or top pinned) and the location of the free layer 120".

A magnetic junction including the free layer 120" may have improved performance. The free layer 120" may have a reduced saturation magnetization due to the low moment of the $[Co_xFe_yB_z]_uMg_t$ layer 124". However, the high perpendicular magnetic anisotropy may be maintained. The $[Co_xFe_yB_z]_uMg_t$ layer 124" may also have low damping. As a result, switching current may be reduced. The perpendicular magnetic anisotropy may remain high. Consequently, the free layer 120" may be thermally stable when quiescent. Thus, performance of a magnetic junction and magnetic device employing such a free layer 120" may be improved.

Figure 5:
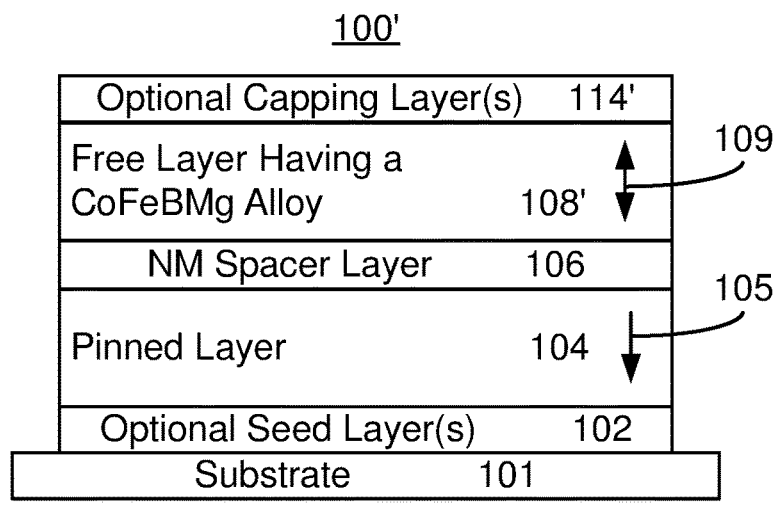
FIG. 5 depicts another exemplary embodiment of a magnetic junction usable in a magnetic devices such as a magnetic memory programmable using spin transfer torque and having a CoFeBMg free layer.

FIG. 5 depicts another exemplary embodiment of a magnetic junction 100' in a magnetic devices such as a magnetic memory programmable using spin transfer torque. For clarity, FIG. 5 is not to scale. The magnetic junction 100' is analogous to the magnetic junction 100. Consequently, similar components have analogous labels. The magnetic junction 100' is a bottom pinned magnetic junction including pinned layer 104, nonmagnetic spacer layer 106 and free layer 108' that are analogous to the pinned layer 104, nonmagnetic spacer layer 106 and free layer 108, respectively. Optional seed layer 102 and capping layer 114' are also shown.

The free layer 108' includes a $[Co_xFe_yB_z]_uMg_t$ alloy. In some embodiments, the free layer 108' may be the free layer 120, 120' or 120". In order to improve the perpendicular magnetic anisotropy of the free layer 108', the nonmagnetic spacer layer 106 is desired to be a crystalline MgO layer. Thus, the nonmagnetic spacer layer 106 also serves as a seed layer 131/131'/131". Such a crystalline MgO tunneling barrier layer 106 may also improve tunneling magnetoresistance and, therefore, signal from the magnetic junction 100'. The capping layers 114' are desired to be analogous to the layer(s) 132, 132' and/or 132". Thus, the capping layer(s) 114' may include one or more of a magnesium oxide layer, a tantalum oxide layer, a magnesium oxide/tantalum oxide bilayer and a titanium oxide layer.

The magnetic junction 100' may have improved performance. The free layer 108' may have a reduced saturation magnetization due to the low moment of the $[Co_xFe_yB_z]_uMg_t$ layer. However, the high perpendicular magnetic anisotropy may be maintained. The free layer 108' may also have low damping. As a result, switching current may be reduced. The perpendicular magnetic anisotropy may remain high. Thus, performance of a magnetic junction 100' and magnetic device employing the magnetic junction 100' may be improved.

Figure 6:
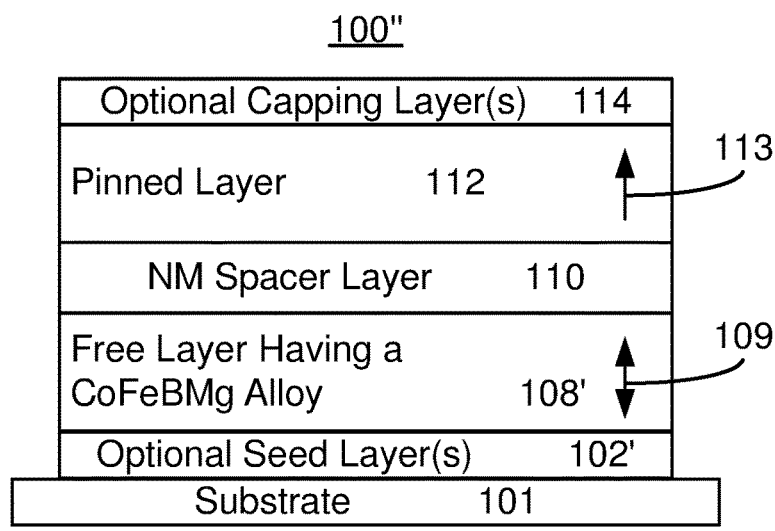
FIG. 6 depicts an exemplary embodiment of a magnetic junction usable in a magnetic devices such as a magnetic memory programmable using spin transfer torque and having a CoFeBMg free layer.

FIG. 6 depicts another exemplary embodiment of a magnetic junction 100" in a magnetic devices such as a magnetic memory programmable using spin transfer torque. For clarity, FIG. 6 is not to scale. The magnetic junction 100" is analogous to the magnetic junction(s) 100 and/or 100'. Consequently, similar components have analogous labels. The magnetic junction 100" is a top pinned magnetic junction including free layer 108', nonmagnetic spacer layer 110 and pinned layer 112 that are analogous to the free layer 108/108', nonmagnetic spacer layer 110 and pinned layer 112. Optional seed layer 102 and capping layer 114' are also shown.

The free layer 108' includes a $[Co_xFe_yB_z]_uMg_t$ alloy. In some embodiments, the free layer 108' may be the free layer 120, 120' or 120". In order to improve the perpendicular magnetic anisotropy of the free layer 108', the nonmagnetic spacer layer 110 is desired to be a crystalline MgO layer. Thus, the nonmagnetic spacer layer 110 also serves as a capping layer 132/132'/132". Such a crystalline MgO tunneling barrier layer 110 may also improve tunneling magnetoresistance and, therefore, signal from the magnetic junction 100". The seed layers 102' are desired to be analogous to the layer(s) 131, 131' and/or 131". Thus, the seed layer(s) 102' may include one or more of magnesium oxide, tantalum oxide and titanium oxide.

The magnetic junction 100" may have improved performance. The free layer 108' may have a reduced saturation magnetization due to the low moment of the $[Co_xFe_yB_z]_uMg_t$ layer. However, the high perpendicular magnetic anisotropy may be maintained. The free layer 108' may also have low damping. As a result, switching current may be reduced. The perpendicular magnetic anisotropy may remain high. Thus, performance of a magnetic junction 100" and magnetic device employing the magnetic junction 100" may be improved.

Figure 7:
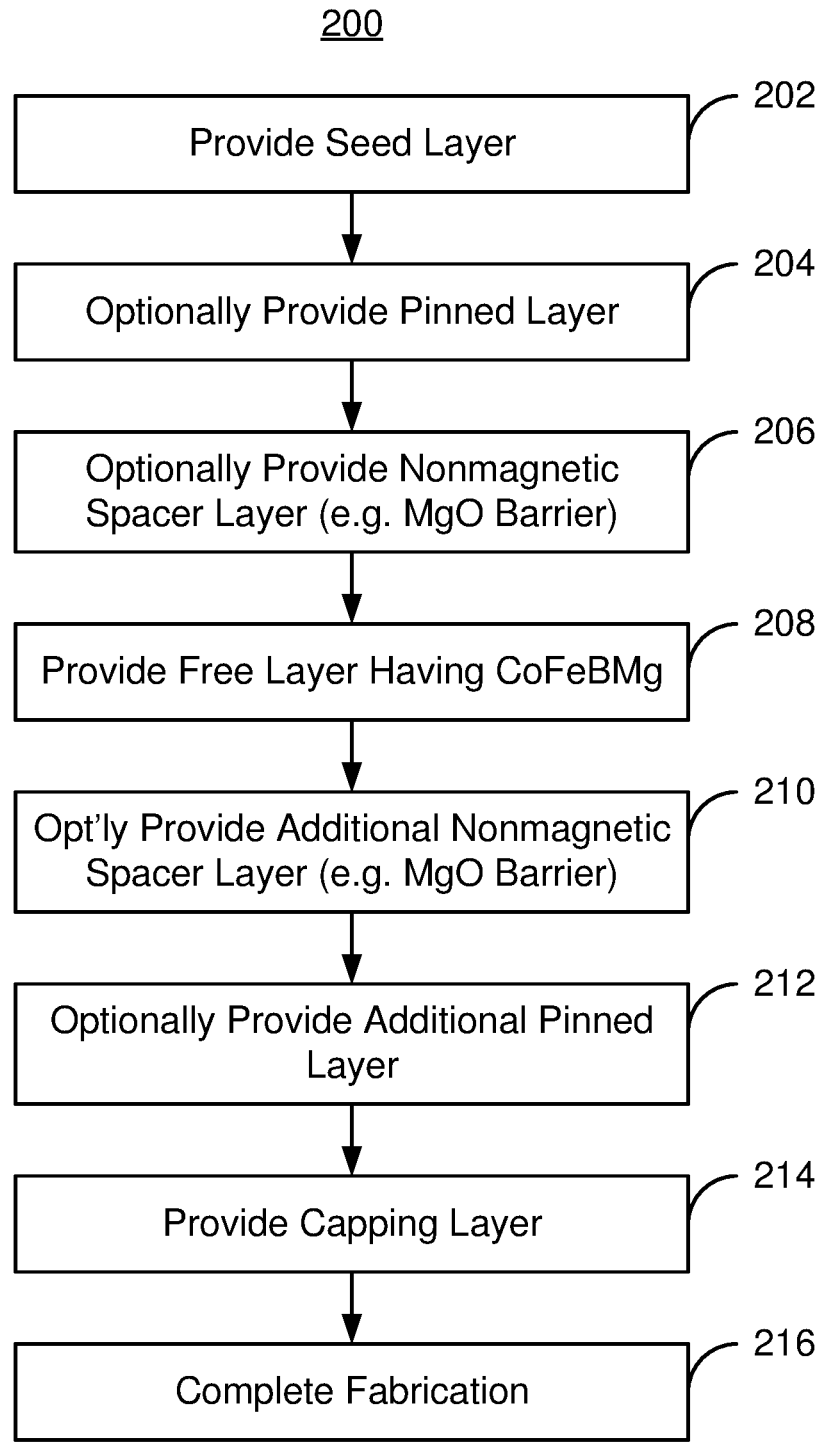
FIG. 7 is a flow chart depicting an exemplary embodiment of a method for providing a magnetic junction usable in a magnetic devices such as a magnetic memory programmable using spin transfer torque and having a CoFeBMg free layer including.

FIG. 7 is a flow chart depicting an exemplary embodiment of a method 200 for providing a layer for magnetic junction usable in a magnetic device and including a $[Co_xFe_yB_z]_uMg_t$ layer in the free layer. For simplicity, some steps may be omitted, performed in another order, include substeps and/or combined. Further, the method 200 start after other steps in forming a magnetic memory have been performed. The method 200 is described in the context of the magnetic junction 100, 100' and 100". However the method 200 may be used in forming other magnetic junction(s) and the free layers 120, 120' and/or 120". Further, multiple magnetic junctions may be simultaneously fabricated.

Seed layer(s) 102 are provided on the substrate, via step 202. Step 202 may include depositing the appropriate seed layer(s) for the pinned layer 104 or for the free layer 108. If the magnetic junction 100 or 100' is being fabricated, then the seed layer(s) for the pinned layer 104 are provided in step 202. If the magnetic junction 100" is being fabricated, then the seed layer(s) 102' for the free layer 108/108' are provided in step 202. Thus, step 202 may include providing one or more of a magnesium oxide layer, a tantalum oxide layer and a titanium oxide layer.

A pinned layer 104 may be provided, via step 204. Step 204 is performed if the entire dual magnetic junction 100 is to be formed or if a bottom pinned magnetic junction 100' that omits the layers 110 and 112 is to be formed. Step 204 may include providing a multilayer structure having a high perpendicular magnetic anisotropy. Thus, the pinned layer 104 formed in step 204 may be a simple (single) layer or may include multiple layers. For example, the pinned layer formed in step 204 may be a synthetic antiferromagnet including magnetic layers antiferromagnetically or ferromagnetically coupled through thin nonmagnetic layer(s), such as $R_U$. Each magnetic layer may also include multiple layers.

A nonmagnetic spacer layer 106 may be provided, via step 206. Step 206 is performed if the dual magnetic junction 100 or a bottom pinned magnetic junction 100' is to be formed. In some embodiments, a crystalline MgO tunneling barrier layer may be desired for the magnetic junction being formed. Step 206 may include depositing MgO using, for example, radio frequency (RF) sputtering. In other embodiments, metallic Mg may be deposited and then oxidized in step 206 to provide a natural oxide of Mg. The MgO barrier layer/nonmagnetic spacer layer 106 may also be formed in another manner. Step 206 may include annealing the portion of the magnetic junction already formed to provide crystalline MgO tunneling barrier with a (100) orientation for enhanced TMR of the magnetic junction. Because the nonmagnetic spacer layer 106 may also be viewed as a seed layer for the free layer 108/108', step 206 may also be seen as forming seed layer(s) 131, 131' and/or 131".

A free layer 108/108' is provided, via step 208. Step 208 includes depositing the material(s) for the free layer 108. If steps 204 and 206 are omitted, then the free layer may be deposited on seed layer(s) in step 208. In such embodiments, a top pinned magnetic junction is fabricated. The seed layer(s) may be selected for various purposes including but not limited to the desired crystal structure of the free layer 108/108', magnetic anisotropy and/or magnetic damping of the free layer 108/108'. For example, the free layer 108' may be provided on seed layer(s) 102' such as a crystalline MgO layer that promotes a perpendicular magnetic anisotropy in the free layer 108/108'. If a dual magnetic junction or bottom pinned magnetic junction is fabricated, the free layer may be formed on a nonmagnetic spacer layer provided in step 208. Step 208 may also be viewed as providing the free layer 120, 120' or 120". Thus, step 208 may include depositing one or more layers including a $[Co_xFe_yB_z]_uMg_t$ layer. A CoFeB layer and/or an Fe layer may also be provided. Step 208 may also include cooling the layers that have been provided before depositing the free layer materials. For example, the portion of the magnetic junction 100 that has been deposited may be cooled after step 206 and during step 208. Such a cooling step may include placing the portion of the magnetic junction 100 that has been deposited in a cooling chamber having a temperature less than room temperature (approximately twenty-three degrees Celsius). In some embodiments, the cooling chamber has a temperature of at least eighty Kelvin and not more than three hundred Kelvin.

An additional nonmagnetic spacer layer 110 may be provided, via step 210. Step 210 is performed if a dual magnetic junction 100 or a top pinned magnetic junction 100" is desired to be fabricated. If a bottom pinned magnetic junction is desired, then step 210 is omitted. In some embodiments, an additional crystalline MgO tunneling barrier layer may be desired for the magnetic junction being formed. Step 210 may thus be performed as described above with respect to step 206. For a dual magnetic junction, the nonmagnetic spacer layer 110 may be considered to be the main tunneling barrier layer. Thus, the thickness and crystallinity of the layer 110 may be optimized in step 210.

An additional pinned 112 layer may optionally be provided, via step 212. Step 212 may be performed if the dual magnetic junction 100 or top pinned magnetic junction 100" is desired to be fabricated. If a bottom pinned magnetic junction 100' is desired, then step 212 is omitted. The pinned layer 112 formed in step 210 may be a simple (single) layer or may include multiple layers. For example, the pinned layer formed in step 210 may be a SAF.

The capping layer(s) 114 may then be provided, via step 214. If the bottom pinned magnetic junction 100" is being formed, then step 214 may include providing at least one of a magnesium oxide layer, a tantalum oxide layer, a magnesium oxide/tantalum oxide bilayer and a titanium oxide layer. Step 214 may thus be seen as providing the capping layer 132, 132' or 132" in some embodiments.

Fabrication of the magnetic junction 100 may then be completed. For example, the edges of the magnetic junction 100 may be defined. This may be accomplished by providing a mask on the layers that have been deposited and ion milling the exposed portions of the layers. In some embodiments, an ion mill may be performed. Thus, the edges of the magnetic junction 100 may be defined after steps 202 through 210 are performed. Alternatively, the edges of various layers may be formed at other times. Additional structures, such as contacts and conductive lines may also be formed for the device in which the magnetic junction is used.

Using the method 200, the magnetic junction 100, the magnetic junction 100' and/or the magnetic junction 100" may be formed. The free layers 108, 108', 120, 120' and/or 120" may be fabricated. As a result, a magnetic junction having free layer(s) with improved switching characteristics may be achieved.

Figure 8:
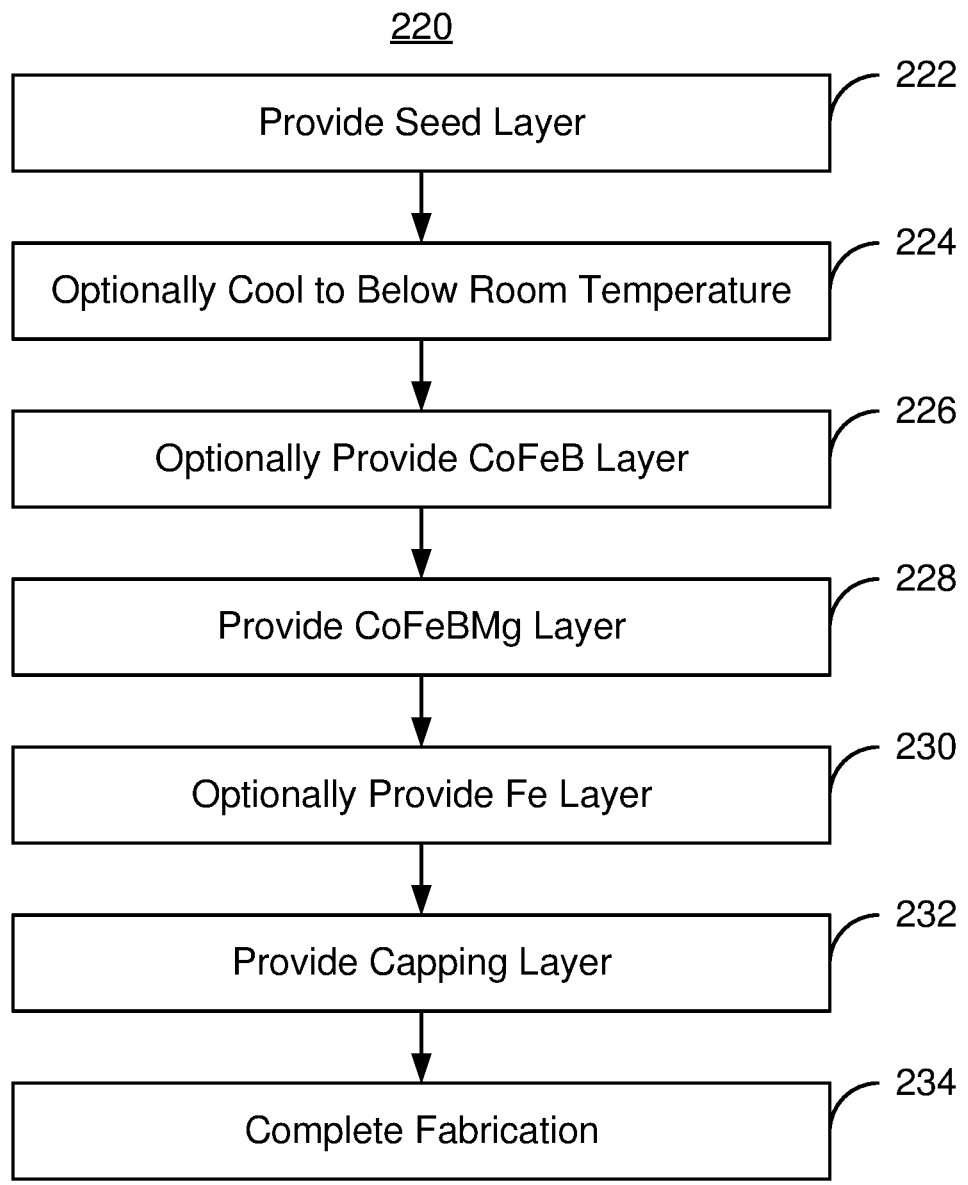
FIG. 8 is a flow chart depicting an exemplary embodiment of a method for providing a CoFeBMg free layer.

FIG. 8 is a flow chart depicting an exemplary embodiment of a method 210 for providing a free layer for magnetic junction usable in a magnetic device. The method 210 may be used to from the free layer 120, 120' and/or 120". For simplicity, some steps may be omitted, performed in another order, include substeps and/or combined. Further, the method 210 start after other steps in forming a magnetic memory have been performed. The method 210 is described in the context of the free layers 120, 120' and 120". However the method 210 may be used in forming other free layer(s). Further, multiple free layers may be simultaneously fabricated.

A seed layer 131/131'/131" that adjoins, or shares an interface with, the free layer 120 is provided, via step 222. In some embodiments, step 222 includes depositing at least one of a magnesium oxide layer, a tantalum oxide layer and a titanium oxide layer. In some embodiments, the seed layer provided in step 222 may form a nonmagnetic spacer layer of the magnetic junction being formed.

The seed layer may be cooled to below room temperature, via step 224. Step 224 is optional and might be skipped in some embodiments. When performed, step 224 is completed before deposition of the materials that will form the free layer.

A CoFeB layer 122 or 122' may be provided, via step 226. Step 226 may be skipped if the free layer 120' is being formed. The $[Co_xFe_yB_z]_uMg_t$ alloy layer 124/124'/124" is provided, via step 226. An Fe layer 126/126' may be provided, via step 230. Step 230 may be skipped if the free layer 120" is being formed. Together, steps 226, 228 and 230 may be viewed as providing at least one of a CoFeB/$[Co_xFe_yB_z]_uMg_t$/Fe trilayer, a $[Co_xFe_yB_z]_uMg_t$/Fe bilayer; and a CoFeB/$[Co_xFe_yB_z]_uMg_t$ bilayer.

A capping layer 132, 132' or 132" is provided, via step 232. Step 232 may include providing at least one of a magnesium oxide layer, a tantalum oxide layer, a magnesium oxide/tantalum oxide bilayer and a titanium oxide layer. Fabrication of the free layer 120, 120' or 120" may then be completed, via step 234. For example, the edges of the free layer 120, 120' or 120" may be defined.

Using the method 210, the free layers 108, 108', 120, 120' and/or 120" may be fabricated. As a result, a magnetic junction having free layer(s) with improved switching characteristics may be achieved.

Figure 9:
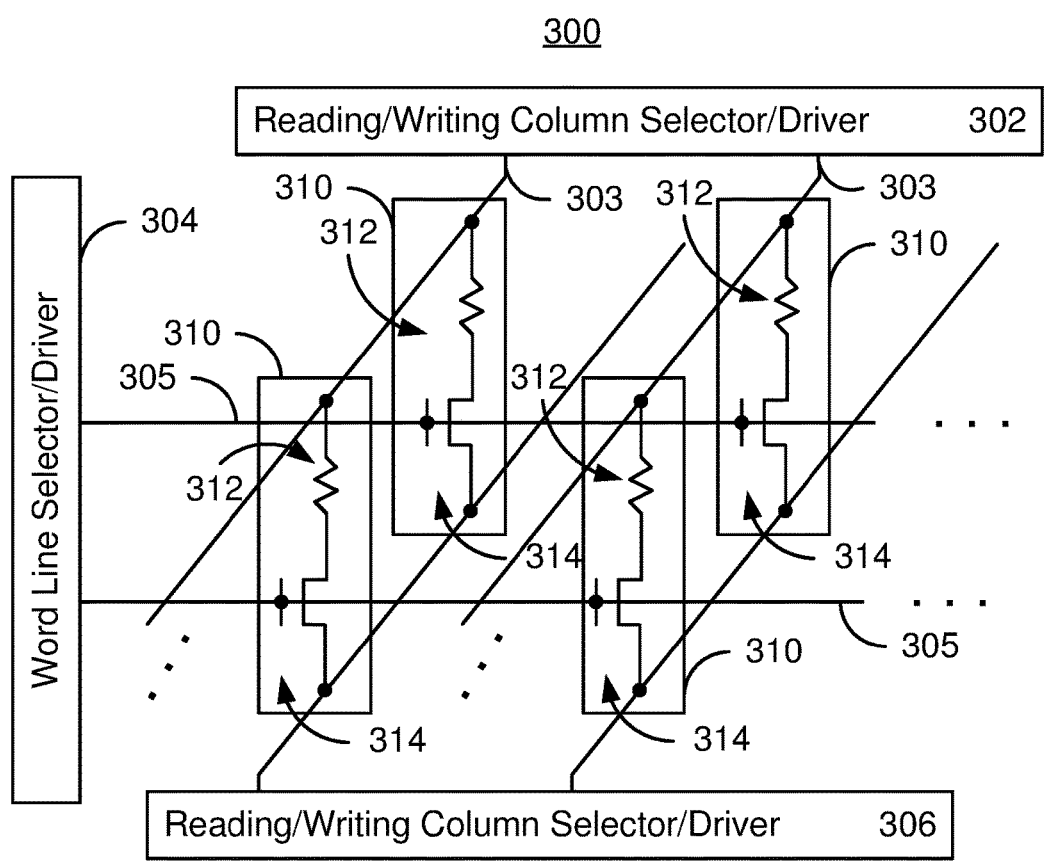
FIG. 9 depicts an exemplary embodiment of a memory utilizing magnetic junctions in the memory element(s) of the storage cell(s).

FIG. 9 depicts an exemplary embodiment of a memory 300 that may use one or more of the magnetic junctions 100, 100' and/or 100" and/or other magnetic junction including a CoFeBMg free layer such as the free layer 120, 120' and/or 120". The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the 100, 100', 100" and/or other magnetic junction including the $[Co_xFe_yB_z]_uMg_t$ layer within the free layer. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device comprising:

a pinned layer;

a nonmagnetic spacer layer; and a free layer, the free layer being switchable between a plurality of stable magnetic states when a write current is passed through the magnetic junction, the nonmagnetic spacer layer residing between the pinned layer and the free layer, the free layer having a free layer perpendicular magnetic anisotropy energy greater than a free layer out-of-plane demagnetization energy, the free layer including an alloy, the alloy including $[Co_xFe_yB_z]_uMg_t$, where u+t=1 and x+y+z=1 and wherein u, t, x, y and z are each nonzero.

2. The magnetic junction of claim 1 wherein the free layer includes at least one of a CoFeB/$[Co_xFe_yB_z]_uMg_t$/Fe trilayer, a $[Co_xFe_yB_z]_uMg_t$/Fe bilayer; and a CoFeB/$[Co_xFe_yB_z]_uMg_t$ bilayer.

3. The magnetic junction of claim 1 where t is not more than 0.35 and at least 0.15.

4. The magnetic junction of claim 1 wherein the alloy is a $[Co_xFe_yB_z]_uMg_t$ layer, the $[Co_xFe_yB_z]_uMg_t$ layer having a thickness of at least three Angstroms and not more than twenty Angstroms.

5. The magnetic junction of claim 4 wherein the thickness is not more than fifteen Angstroms.

6. The magnetic junction of claim 1 wherein the nonmagnetic spacer layer includes MgO and adjoins the free layer.

7. The magnetic junction of claim 1 further comprising:

a seed layer adjoining the free layer, the seed layer including at least one of a magnesium oxide layer, a tantalum oxide layer and a titanium oxide layer.

8. The magnetic junction of claim 1 wherein the nonmagnetic spacer layer is between the free layer and the substrate and wherein the magnetic junction further includes a capping layer, the capping layer including at least one of a magnesium oxide layer, a tantalum oxide layer, a magnesium oxide/tantalum oxide bilayer and a titanium oxide layer.

9. The magnetic junction of claim 1 further comprising:

an additional nonmagnetic spacer layer, the free layer being between the additional nonmagnetic spacer layer and the nonmagnetic spacer layer; and an additional pinned layer, the additional nonmagnetic spacer layer being between the additional pinned layer and the free layer.

10. A magnetic memory residing on a substrate and comprising:

a plurality of magnetic storage cells, each of the plurality of magnetic storage cells including at least one magnetic junction including a pinned layer, a nonmagnetic spacer layer and a free layer, the free layer being switchable between a plurality of stable magnetic states when a write current is passed through the magnetic junction, the nonmagnetic spacer layer residing between the pinned layer and the free layer, the free layer having a free layer perpendicular magnetic anisotropy energy greater than a free layer out-of-plane demagnetization energy, the free layer including an alloy, the alloy including $[Co_xFe_yB_z]_uMg_t$, where u+t=1 and x+y+z=1, and wherein u, t, x, y and z are each nonzero, the free layer including at least one of a CoFeB/$[Co_xFe_yB_z]_uMg_t$/Fe trilayer, a $[Co_xFe_yB_z]_uMg_t$/Fe bilayer; and a CoFeB/$[Co_xFe_yB_z]_uMg_t$ bilayer;

a plurality of bit lines coupled with the plurality of magnetic storage cells.

11. A method for providing magnetic junction residing on a substrate and usable in a magnetic device, the method comprising:

providing a pinned layer;

providing a nonmagnetic spacer layer, and providing a free layer, the free layer being switchable between a plurality of stable magnetic states when a write current is passed through the magnetic junction, the nonmagnetic spacer layer residing between the pinned layer and the free layer, the free layer having a free layer perpendicular magnetic anisotropy energy greater than a free layer out-of-plane demagnetization energy, the free layer including a $[Co_xFe_yB_z]_uMg_t$ layer, where u+t=1 and x+y+z=1 and wherein u, t, x, y and z are each nonzero.

12. The method of claim 11 wherein the step of providing the free layer includes:

providing at least one of a CoFeB/$[Co_xFe_yB_z]_uMg_t$/Fe trilayer, a $[Co_xFe_yB_z]_uMg_t$/Fe bilayer; and a CoFeB/$[Co_xFe_yB_z]_uMg_t$ bilayer.

13. The method of claim 11 wherein t is not more than 0.35 and at least 0.15.

14. The method of claim 11 wherein the $[Co_xFe_yB_z]_uMg_t$ layer has a thickness of at least three Angstroms and not more than twenty Angstroms.

15. The method of claim 11 further comprising:

providing a seed layer adjoining the free layer, the seed layer including at least one of a magnesium oxide layer, a tantalum oxide layer and a titanium oxide layer; and cooling the MgO layer to below twenty three degrees Celsius before providing the free layer.

16. The method of claim 11 wherein the nonmagnetic spacer layer is between the free layer and the substrate and wherein the method further includes:

providing a capping layer, the capping layer including at least one of a magnesium oxide layer, a tantalum oxide layer, a magnesium oxide/tantalum oxide bilayer and a titanium oxide layer.

17. The method of claim 11 further comprising:

providing an additional nonmagnetic spacer layer, the free layer being between the additional nonmagnetic spacer layer and the nonmagnetic spacer layer; and providing an additional pinned layer, the additional nonmagnetic spacer layer being between the additional pinned layer and the free layer.

* * * * *